US007129643B2

(12) United States Patent
Shin et al.

(10) Patent No.: US 7,129,643 B2
(45) Date of Patent: Oct. 31, 2006

(54) LIGHT-EMITTING DISPLAY, DRIVING METHOD THEREOF, AND LIGHT-EMITTING DISPLAY PANEL

(75) Inventors: Dong-Yong Shin, Suwon-si (KR); Keum-Nam Kim, Suwon-si (KR); Do-Hyung Ryu, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 10/969,438

(22) Filed: Oct. 19, 2004

(65) Prior Publication Data

US 2005/0093464 A1 May 5, 2005

(30) Foreign Application Priority Data

Oct. 29, 2003 (KR) ...................... 10-2003-0076002

(51) Int. Cl.
*G09G 3/10* (2006.01)
*G09G 5/00* (2006.01)
*H01L 27/10* (2006.01)
*H01L 29/73* (2006.01)

(52) U.S. Cl. .............................. 315/169.3; 315/169.4; 345/204; 257/208

(58) Field of Classification Search ................ 315/167, 315/168, 169.1, 169.3, 169.4; 345/204, 205, 345/694, 214, 41, 42, 44–46, 50–52; 257/83, 257/84, 206, 207, 208
See application file for complete search history.

(56) References Cited

U.S. PATENT DOCUMENTS

| | | | | |
|---|---|---|---|---|
| 6,046,890 | A * | 4/2000 | Yamada et al. | 360/323 |
| 6,229,506 | B1 * | 5/2001 | Dawson et al. | 345/82 |
| 6,847,172 | B1 * | 1/2005 | Suzuki | 315/169.3 |
| 6,864,637 | B1 * | 3/2005 | Park et al. | 315/169.1 |
| 6,885,029 | B1 * | 4/2005 | Miyazawa | 257/59 |
| 2003/0227262 | A1 * | 12/2003 | Kwon | 315/169.3 |
| 2004/0145547 | A1 * | 7/2004 | Oh | 345/76 |
| 2004/0239599 | A1 * | 12/2004 | Koyama | 345/76 |
| 2005/0068271 | A1 * | 3/2005 | Lo | 345/76 |
| 2005/0156829 | A1 * | 7/2005 | Choi et al. | 345/76 |

* cited by examiner

*Primary Examiner*—Don Wong
*Assistant Examiner*—Marie Antoinette Cabucos
(74) *Attorney, Agent, or Firm*—Christie, Parker & Hale, LLP

(57) ABSTRACT

A pixel circuit of an organic EL display includes a driving transistor for transmitting a driving current to an organic EL element. A first capacitor is connected between a gate and a source of the driving transistor, and a second capacitor is connected between the gate thereof and a boosting scan line. A voltage corresponding to a data current from a data line is stored in the first capacitor in response to a select signal from a selecting scan line. The voltage level of the boosting scan line is changed so that the voltage of the first capacitor is changed by coupling of the first and second capacitors. The driving current corresponding to the changed voltage flows to the organic EL element to emit light. As a result, the current flowing to the organic EL element can be controlled using a large data current, and the influence of the parasitic capacitance components of the transistors or data lines can be minimized.

22 Claims, 14 Drawing Sheets

LIGHT-EMITTING DISPLAY, DRIVING METHOD THEREOF, AND LIGHT-EMITTING DISPLAY PANEL

CROSS REFERENCE TO RELATED APPLICATION

This application claims priority to and the benefit of Korean Patent Application No. 10-2003-0076002 filed on Oct. 29, 2003 in the Korean Intellectual Property Office, the entire content of which is incorporated herein by reference.

BACKGROUND OF THE INVENTION (a) Field of the Invention

The present invention relates to a light-emitting display, a driving method thereof, and a light-emitting display panel. More particularly, the present invention relates to a current programming method in an active matrix display using electroluminescence of an organic material.

(b) Description of the Related Art

An organic electroluminescent (EL) display is a display that emits light by electrical excitation of fluorescent organic compounds. Using the organic EL display, an image is displayed by driving each of N×M organic luminescent cells with voltage or current.

The organic luminescent cell has characteristics of a diode, and in general is called an organic light-emitting diode (OLED). The organic luminescent cell includes an anode (indium tin oxide (ITO) or metal), an organic thin film, and a cathode layer. As shown in FIG. 1, the organic thin film is formed as a multi-layered structure including an emission layer (EML), an electron transport layer (ETL), and a hole transport layer (HTL) so as to increase luminescence efficiency by balancing electron and hole concentrations. In addition, it may also include an electron injection layer (EIL) and a hole injection layer (HIL) separately.

Organic EL displays that have such organic luminescent cells are configured as a passive matrix configuration or an active matrix configuration using thin film transistors (TFTs) or metal-oxide semiconductor field-effect transistors (MOSFETs). In the passive matrix configuration, organic luminescent cells are formed between anode lines and cathode lines that cross (i.e., cross over) each other, and the organic luminescent cells are driven by driving the anode and cathode lines. In the active matrix configuration, each organic luminescent cell is connected to a TFT usually through a pixel electrode and is driven by controlling the gate voltage of the corresponding TFT. The active matrix method may be classified as a voltage programming method and/or a current programming method depending on the format of signals that are applied to the capacitor so as to maintain the voltage.

Referring to FIGS. 2 and 3, a conventional organic EL display of the voltage and current programming methods will be described.

FIG. 2 illustrates a pixel circuit pursuant to the conventional voltage programming method for driving an organic EL element. FIG. 2 illustrates one of the N×M pixels as an example. A p-channel transistor M1 is connected to an organic EL element OLED to supply a current for emission from a voltage source VDD, and the current of the transistor M1 is controlled by a data voltage applied through a switching transistor M2. A capacitor C1 for maintaining the applied voltage for a predetermined time is connected between a source of the transistor M1 and a gate thereof. A gate of the switching transistor M2 is connected to a scan line $S_n$, and a source thereof is connected to a data line $D_m$.

When the switching transistor M2 is turned on in response to a select signal applied to the gate of the switching transistor M2, a data voltage from the data line $D_m$ is applied to the gate of the transistor M1. The current $I_{OLED}$, corresponding to the voltage $V_{GS}$ charged between the gate and the source of the transistor M1 by the capacitor C1, flows to the drain of the transistor M1, and the organic EL element OLED emits light corresponding to the current $I_{OLED}$. In this case, the current $I_{OLED}$ flowing to the organic EL element OLED is expressed in Equation 1.

Equation 1:

$$I_{OLED} = \frac{\beta}{2}(V_{GS} - V_{TH})^2 = \frac{\beta}{2}(V_{DD} - V_{DATA} - |V_{TH}|)^2$$

where $I_{OLED}$ is a current flowing to the organic EL element OLED, $V_{GS}$ is a voltage between the source and the gate of the transistor M1, $V_{TH}$ is a threshold voltage at the transistor M1, $V_{DATA}$ is a data voltage, and β is a constant.

As expressed in Equation 1, the current corresponding to the applied data voltage is applied to the organic EL element OLED, and the organic EL element emits light with a brightness corresponding to the applied current. The applied data voltage has multiple-stage values within a predetermined range so as to display gray scales.

However, it is difficult for the conventional pixel circuit of the voltage programming method to obtain a wide spectrum of gray scales because of deviations of the threshold voltage $V_{TH}$ of the TFT and electron mobility caused by non-uniformity in the manufacturing process. For example, for driving a TFT in the pixel circuit by supplying a 3V voltage, the voltage is to be applied to the gate of the TFT at 12 mV (=3V/256) intervals to express 8-bit (256) grays. If the deviation of the threshold voltage at the TFT caused by the non-uniformity of the manufacturing process is greater than 100 mV, it becomes difficult to express a wide spectrum of gray scales. It is also difficult to express a wide spectrum of gray scales because β in Equation 1 becomes differentiated due to deviation of the electron mobility.

However, if the current source can supply substantially uniform current to the pixel circuit over the whole data line, the pixel circuit of the current programming method generates substantially uniform display characteristics even when a driving transistor in each pixel has non-uniform voltage-current characteristics.

FIG. 3 shows a conventional pixel circuit of the current programming method for driving an organic EL element, illustrating one of the N×M pixels as an example. In FIG. 3, a transistor M1' is connected to an organic EL element OLED to supply the current for emission to the OLED, and the current of the transistor M1' is set to be controlled by the data current applied through a transistor M2'.

First, when the transistors M2' and M3' are turned on according to a select signal from a scan line $S_n$, the transistor M1' is diode-connected, and the capacitor C1' is charged by the data current $I_{DATA}$ so that the gate voltage of the transistor M1' is reduced and the current flows from the source to the drain of the transistor M1'. When the capacitor C1' is charged so that the drain current of the transistor M1' is the same as the drain current of the transistor M2', i.e., the data current $I_{DATA}$, the charging of the capacitor C1' is stopped. As a result, a voltage corresponding to the data current $I_{DATA}$ from the data line $D_m$ is stored in the capacitor C1'. Next, the select signal from the scan line $S_n$ becomes a high level voltage to turn off the transistors M2' and M3', and an emit signal from a scan line $E_n$ becomes a low level voltage to turn on the transistor M4'. Voltage is then supplied from the voltage source VDD, and the current corresponding to the voltage stored in the capacitor C1' flows to the organic EL element OLED to emit light. In this case, the current flowing to the organic EL element OLED is expressed in Equation 2.

Equation 2:

$$I_{OLED} = \frac{\beta}{2}(V_{GS} - V_{TH})^2 = I_{DATA}$$

where $V_{GS}$ is a voltage between the source and the gate of the transistor M1', $V_{TH}$ is a threshold voltage at the transistor M1', and β is a constant.

As expressed in Equation 2, because the current $I_{OLED}$ flowing to the organic EL element is matched with the data current $I_{DATA}$ in the conventional current pixel circuit, an organic EL panel has substantially uniform characteristics when a programming current source is uniform over the organic EL panel. However, because the current $I_{OLED}$ flowing to the organic EL element is a micro-current, it takes a long time to charge the data line in order to control the pixel circuit using the micro-current $I_{DATA}$. For example, if the load capacitance of the data line is 30 pico farads (pF), it takes several milliseconds to charge the load of the data line with the data current of about several tens to several hundreds of nano amperes (nA). Taking a long time to charge the data line is problematic because the charging time is not sufficient (i.e., too long) when considering the data line time of several tens of micro seconds (μs).

SUMMARY OF THE INVENTION

In exemplary embodiments of the present invention, is provided a light-emitting device for compensating for a threshold voltage and electron mobility of a transistor for fully charging a data line.

In one aspect of the present invention, is provided a light-emitting display including a plurality of data lines for transmitting data currents, a plurality of first scan lines for transmitting select signals, a plurality of second scan lines for transmitting first control signals, and a plurality of pixel circuits respectively formed at a plurality of pixel areas defined by the data lines and the first scan lines. Each said pixel circuit includes a light-emitting element for emitting light based on a driving current, which is applied thereto, and a first switching element for transmitting a corresponding said data current from a corresponding said data lines in response to a corresponding said select signal from a corresponding said first scan line. Each said pixel also includes a first transistor for supplying the driving current applied to the light-emitting element to emit light, and being diode-connected while the corresponding said data current is transmitted from the corresponding said data line, a first storage element for storing a first voltage corresponding to the corresponding said data current from the corresponding said data line, and a second storage element coupled between the first storage element and a corresponding said second scan line, for converting the first voltage of the first storage element into a second voltage through coupling to the first storage element when the corresponding said first control signal is switched from a first level to a second level. The first transistor supplies the driving current corresponding to the second voltage, and the light-emitting element emits light with a brightness corresponding to the driving current.

In one exemplary embodiment, each said pixel circuit further includes a second switching element for transmitting the driving current to the light-emitting element in response to a corresponding one of second control signals.

In another exemplary embodiment, a period during which the corresponding one of the second control signals has a disable level includes a period during which the corresponding said select signal has an enable level.

In still another exemplary embodiment, a period during which the corresponding said first control signal has a first level includes a period during which the corresponding said select signal has an enable level.

In a further exemplary embodiment, a period during which the corresponding one of the second control signals has a disable level includes a period during which the corresponding said first control signal has a first level.

In a yet further exemplary embodiment, the light-emitting display further includes a first scan driver for supplying the select signals to the first scan lines, and a second scan driver for supplying the first control signals to the second scan lines. The second scan driver includes a buffer for determining a magnitude of a first level and a second level of the first control signals and for outputting the first control signals.

In a still further exemplary embodiment, the buffer receives an input signal corresponding to the corresponding said first control signal, and respectively outputs the first level voltage and the second level voltage according to the input signal and an inverted signal of the input signal to the second scan lines.

In another aspect of the present invention, is provided a method for driving a light-emitting display having a plurality of data lines for transmitting data signals, a plurality of first scan lines for transmitting select signals, a plurality of second scan lines for transmitting first control signals, and a plurality of pixel circuits coupled to the data lines, the first scan lines and the second scan lines. Each said pixel circuit includes a first switching element for transmitting a corresponding said data signal from a corresponding said data line in response to a first level of a corresponding said select signal, a transistor, a first storage element coupled between a main electrode and a control electrode of the transistor, a second storage element coupled between the control electrode of the transistor and a corresponding said second scan line, and a light-emitting element for emitting light based on a driving current from the transistor. The driving method includes: charging a voltage corresponding to the corresponding said data signal in the first storage element by changing the corresponding said select signal from a third level to the first level while maintaining the corresponding said first control signal at the second level; and changing the corresponding said select signal from the first level to the third level so as to interrupt the corresponding said data signal, and changing the voltage of the first storage element by changing the corresponding said first control signal from the second level to a fourth level.

In one exemplary embodiment, a period during which the corresponding said first control signal has the second level includes a period during which the corresponding said select signal has the first level.

In still another aspect of the present invention, is provided a light-emitting display panel comprising a plurality of data lines for transmitting data currents, a plurality of scan lines for transmitting select signals, and a plurality of pixel circuits respectively formed at a plurality of pixel areas defined by the data lines and the scan lines. Each said pixel circuit includes a light-emitting element for emitting light based on a driving current, which is applied thereto, a transistor for supplying the driving current for emitting the light-emitting element, and a first switching element for transmitting a corresponding said data current from a corresponding said data line to the transistor in response to a corresponding said select signal from a corresponding said scan line. Each said pixel circuit also includes a second switching element for diode-connecting the transistor, a first storage element coupled between a first main electrode and a control electrode of the transistor, and a second storage element coupled between the control electrode of the transistor and a signal line for transmitting a first control signal.

In one exemplary embodiment, a period during which the second control signal has a disable level includes a period during which the first control signal has the first level, and a period during which the first control signal has the first level includes a period during which the select signal has an enable level.

DETAILED DESCRIPTION

Figure 1:
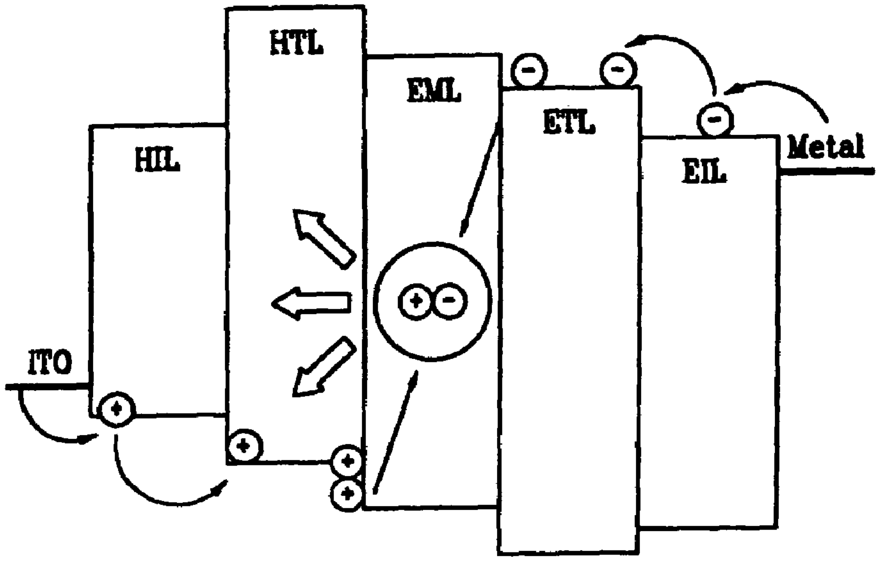
FIG. 1 (Prior Art)
FIG. 1 shows a conceptual diagram of an organic EL element.
Figure 2:
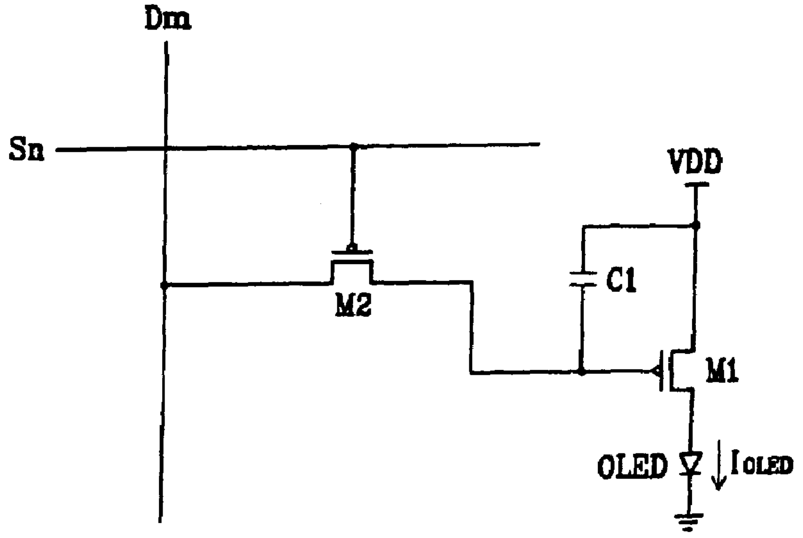
FIG. 2 (Prior Art)
FIG. 2 shows a circuit of a conventional pixel circuit pursuant to a voltage driving method.
Figure 3:
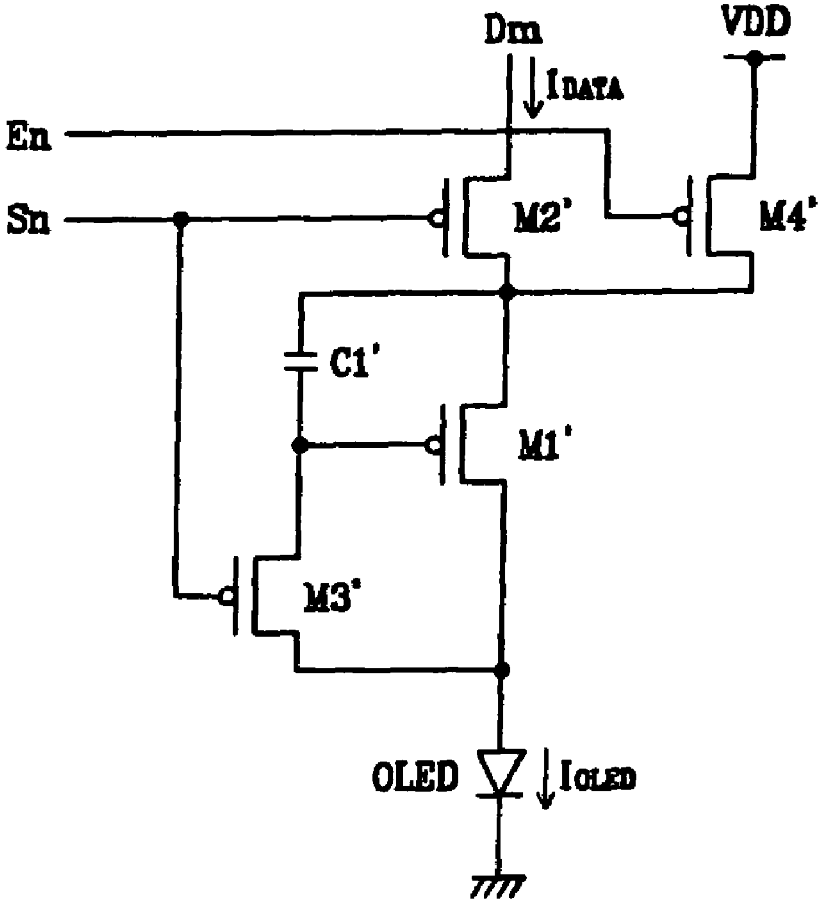
FIG. 3 (Prior Art)
FIG. 3 shows a circuit of a conventional pixel circuit pursuant to a current programming method.

In the following detailed description, only certain exemplary embodiments of the present invention are shown and described. As those skilled in the art would realize, the described embodiments may be modified in various different ways, all without departing from the spirit or scope of the present invention. Accordingly, the drawings and description are to be regarded as illustrative in nature, and not restrictive.

To clearly describe the various exemplary embodiments of the present invention, one or more portions that are not related to the description are omitted in the drawings. Also, in the following description, like elements have like reference numerals. Further, it should be understood that in the following description, connecting of a first portion to a second portion includes direct connecting of the first portion to the second portion, as well as connecting of the first portion to the second portion through a third portion provided between the first and second portions. Also, a reference numeral of a signal applied to a pixel circuit through each scan line is matched with that of the scan line for ease of description.

Figure 4:
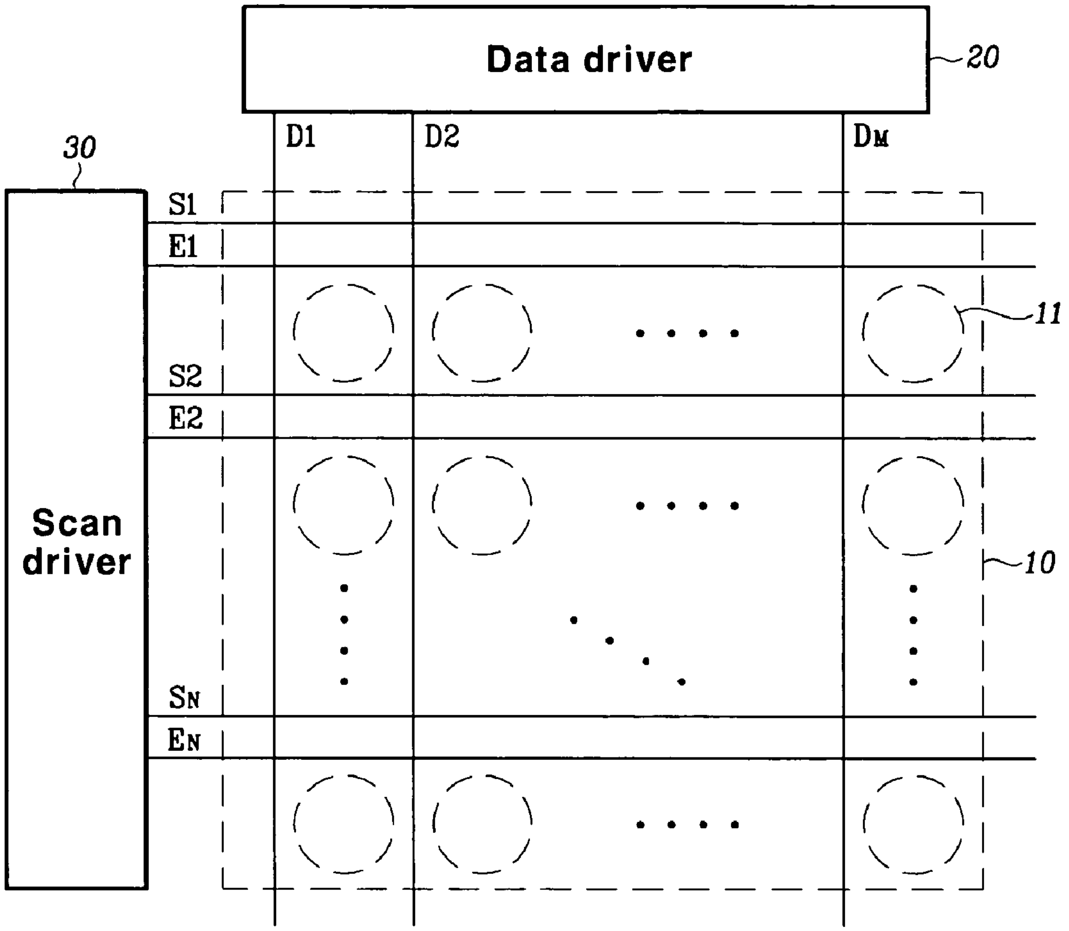
FIG. 4 shows a brief schematic diagram of an organic EL display according to an exemplary embodiment of the present invention.

FIG. 4 shows a brief schematic diagram of an organic EL display according to a first exemplary embodiment of the present invention.

The organic EL display shown in FIG. 4 includes an organic EL display panel 10, a data driver 20, and a scan driver 30. The organic EL display panel 10 includes a plurality of data lines $D_1$–$D_M$ extending in the longitudinal direction, a plurality of scan lines $S_1$–$S_N$ and $E_1$–$E_N$ extending in the transverse direction; and a plurality of pixel circuits 11. The data lines $D_1$–$D_M$ transmit data currents for displaying video signals to the pixel circuits 11, the selecting scan lines $S_1$–$S_N$ transmit select signals to the pixel circuits 11, and the emitting scan lines $E_1$–$E_N$ transmit emit signals to the pixel circuits 11. Each pixel circuit 11 is formed at a pixel region defined by two adjacent data lines and two adjacent scan lines.

To drive the pixel circuits 11, the data driver 20 applies the data currents to the data lines $D_1$–$D_M$, and the scan driver 30 sequentially applies a select signal and an emit signal to the selecting scan lines $S_1$–$S_N$ and the emitting scan lines $E_1$–$E_N$, respectively.

Next, one of the pixel circuits 11 of the organic EL display according to the first exemplary embodiment of the present invention will be described with reference to FIG. 5, which shows a circuit diagram of a pixel circuit according to a first exemplary embodiment of the present invention. For ease of description, FIG. 5 only shows the pixel circuit connected to the $m^{th}$ data line $D_m$ and the $n^{th}$ scan line $S_n$.

Figure 5:
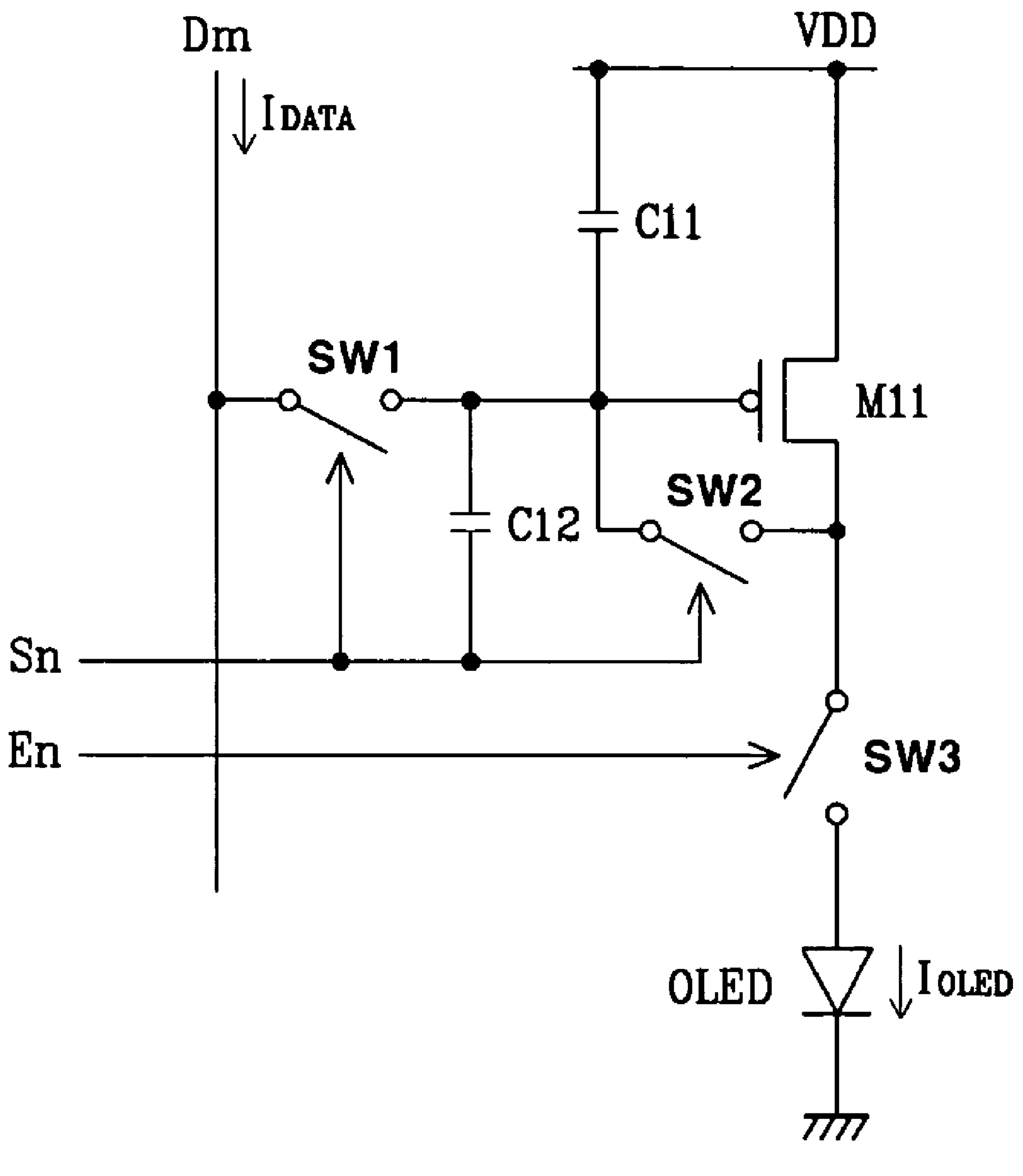
FIG. 5 shows a circuit diagram of a pixel circuit according to a first exemplary embodiment of the present invention.

As shown in FIG. 5, the pixel circuit 11 includes an organic EL element OLED, a transistor M11, switches SW1, SW2, and SW3, and capacitors C11 and C12. In this exemplary embodiment, the transistor M11 may be, for example, a p-channel transistor. The switch SW1 is connected between the data line $D_m$ and the gate of the transistor M11, and transmits the data current $I_{DATA}$ provided from the data line $D_m$ to the transistor M11 in response to the select signal provided from the selecting scan line $S_n$. The switch SW2 is connected between the drain and the gate of the transistor M11, and diode-connects the transistor M11 in response to the select signal from the selecting scan line $S_n$.

The transistor M11 has a source connected to the voltage source VDD, and a drain connected to the switch SW3. The gate-source voltage of the transistor M11 is determined in relation to the data current $I_{DATA}$, and the capacitor C11 is connected between the gate and the source of the transistor M11 to help maintain the gate-source voltage of the transistor M11 for a predetermined time. The capacitor C12 is connected between the selecting scan line $S_n$ and the gate of the transistor M11 to help control the voltage at the gate of the transistor M11. The switch SW3 applies the current flowing to the transistor M11 to the organic EL element OLED in response to the emit signal provided from the scan line $E_n$. The organic EL element is connected between the switch SW3 and a cathode voltage, and the organic EL element emits light matched with the current flowing to the transistor M11. The cathode voltage is a voltage lower than the voltage VDD, for example, a ground voltage or a negative voltage when the transistor M11 is a p-channel transistor.

Figure 6:
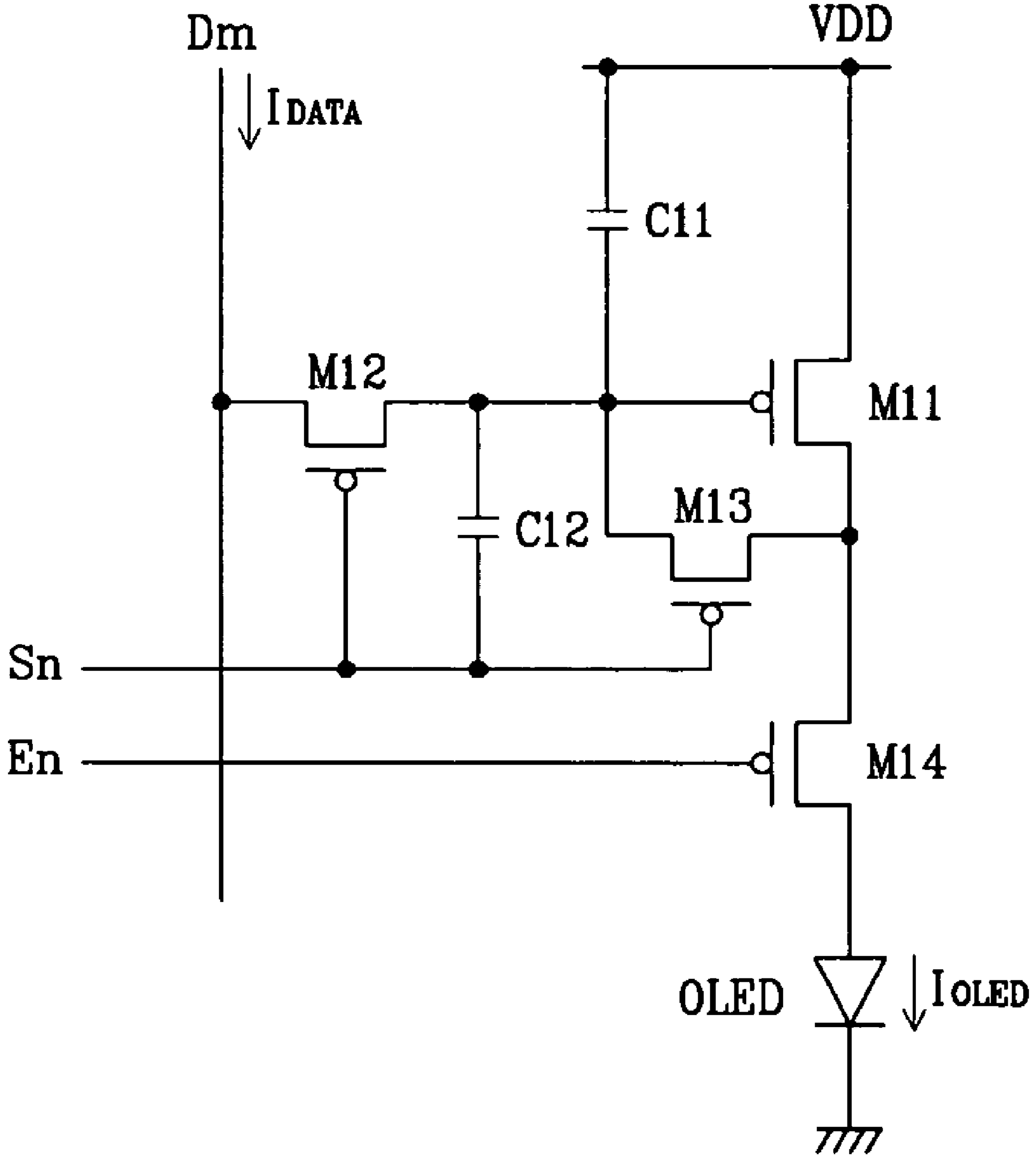
FIGS. 6 and 8 respectively show circuit diagrams of a pixel circuit according to second and third exemplary embodiments of the present invention.
Figure 7:
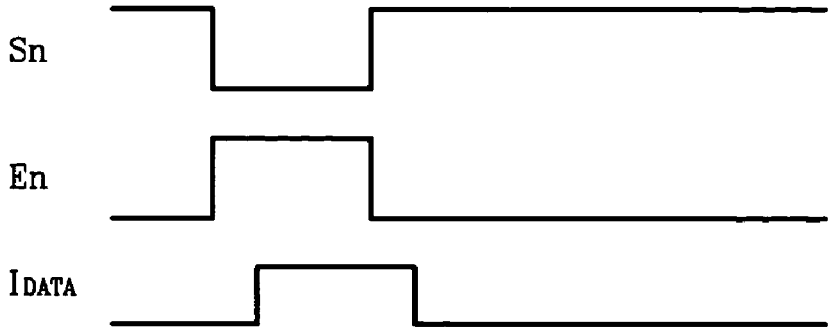
FIGS. 7 and 9 respectively show driving waveform diagrams for driving the pixel circuits of FIGS. 6 and 8.

In this exemplary embodiment, the switches SW1, SW2, and SW3 are depicted as general switches. These switches may be transistors, for example, or any other suitable switching devices. Referring to FIGS. 6 and 7, an exemplary embodiment for realizing the switches SW1, SW2, and SW3 using p-channel transistors will be described in detail.

FIG. 6 shows an equivalent circuit of a pixel circuit according to a second exemplary embodiment of the present invention, and FIG. 7 shows a driving waveform for driving the pixel circuit of FIG. 6.

As shown in FIG. 6, the pixel circuit has a structure which is substantially the same as that of the first exemplary embodiment, except that transistors M12, M13, and M14 are provided instead of the switches SW1, SW2, and SW3 in the pixel circuit of FIG. 5. In this exemplary embodiment, the transistors M12, M13, and M14 are p-channel transistors, gates of the transistors M12 and M13 are connected to the selecting scan line $S_n$, and a gate of the transistor M14 is connected to the emitting scan line $E_n$.

An operation of the pixel circuit of FIG. 6 will be described with reference to FIG. 7. When the transistors M12 and M13 are turned on in response to a select signal with a low level (an enable level) voltage applied through the selecting scan line $S_n$, the transistor M1 is diode-connected, and the data current $I_{DATA}$ provided from the data line $D_m$ flows to the transistor M11. Since the transistor M14 is turned off in response to an emit signal of a high level (a disable level) applied from the emitting scan line $E_n$, the transistor M11 is electrically decoupled from the organic EL element OLED.

In this case, the absolute voltage $V_{GS}$ between the gate and the source (hereinafter, "gate-source voltage") at the transistor M11 and the current $I_{DATA}$ flowing to the transistor M11 satisfy Equation 3, and thus, the gate-source voltage $V_{GS}$ at the transistor M11 may be found from Equation 4.

Equation 3:

$$I_{DATA} = \frac{\beta}{2}(V_{GS} - V_{TH})^2$$

where β is a constant, and $V_{TH}$ is a threshold voltage at the transistor M11.

Equation 4:

$$V_{GS} = \sqrt{\frac{2I_{DATA}}{\beta}} + V_{TH}$$

Next, when the select signal of the selecting scan line $S_n$ is a high level (a disable level) voltage, and the emit signal of the emitting scan line $E_n$ is a low level (an enable level) voltage, the transistors M12 and M13 are turned off, and the transistor M14 is turned on. When the select signal of the selecting scan line $S_n$ is switched to the high level voltage from the low level voltage, the voltage at a common node of the capacitor C12 and the scan line $S_n$ increases by a level rise height of the select signal $S_n$. Therefore, the gate voltage $V_G$ of the transistor M11 increases because of coupling of the capacitors C11 and C12, and the increment is expressed in Equation 5.

Equation 5:

$$\Delta V_G = \frac{\Delta V_S C_{12}}{C_{11} + C_{12}}$$

where $C_{11}$ and $C_{12}$ are the capacitances of the capacitors C11 and C12, respectively.

In view of the increase in the gate voltage $V_G$ of the transistor M11, the current $I_{OLED}$ flowing to the transistor M11 is expressed in Equation 6. Since the gate-source voltage $V_{GS}$ of the transistor M11 is reduced by the increase at the gate voltage $V_G$ of the transistor M11, the drain current $I_{OLED}$ can be smaller than the data current $I_{DATA}$. In addition, when the transistor M14 is turned on because the emit signal of the emitting scan line $E_n$ is a low level voltage, the current $I_{OLED}$ of the transistor M11 is applied to the organic EL element OLED to emit light.

Equation 6:

$$I_{OLED} = \frac{\beta}{2}(V_{GS} - \Delta V_G - V_{TH})^2 = \frac{\beta}{2}\left(\sqrt{\frac{2I_{DATA}}{\beta}} - \Delta V_G\right)^2$$

By solving Equation 6 for the data current $I_{DATA}$, it can be seen that the data current $I_{DATA}$ may be set to be greater than the current $I_{OLED}$ flowing to the organic EL element OLED as expressed in Equation 7. That is, because the micro-current flowing to the organic EL element is controlled using the big data current $I_{DATA}$, an amount of time for charging the data line is sufficient.

Equation 7:

$$I_{DATA} = I_{OLED} + \Delta V_G\sqrt{2\beta I_{OLED}} + \frac{\beta}{2}(\Delta V_G)^2$$

In the second exemplary embodiment, the transistor M12 is driven using the select signal from the scan line $S_n$, but the ratio $C_{12}/(C_{11}+C_{12})$ of the capacitors C11 and C12 can be changed by the parasitic capacitance components of the transistors M11, M12, and M13. However, because the select signal has a constant voltage level, it is difficult to appropriately cope with the variation of the ratio $C_{12}/(C_{11}+C_{12})$ of the capacitors C11 and C12. Accordingly, the increasing amount $\Delta V_G$ of the gate voltage $V_G$ at the transistor M11 is changed in Equation 6 so that the current $I_{OLED}$ is changed in Equation 7. That is, the current $I_{OLED}$ applied to the organic EL element OLED is different from the desired current so that the brightness is changed.

The node of the capacitor C12 may be driven to the signal line separate from the selecting scan line $S_n$, which will be described with reference to FIG. 8.

Figure 8:
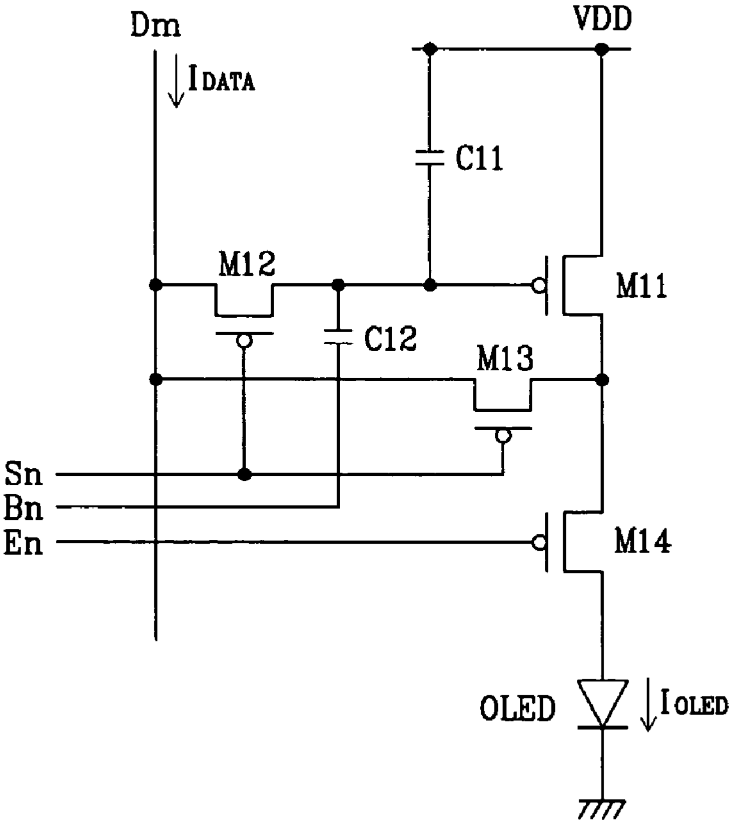
Figure 9:
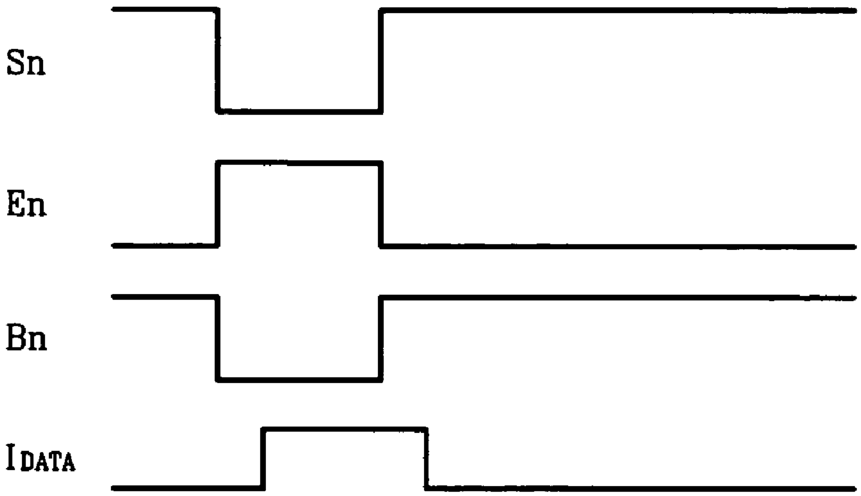

FIG. 8 shows a pixel circuit according to a third exemplary embodiment of the present invention, and FIG. 9 shows a driving waveform diagram for driving the pixel circuits of FIG. 8.

As shown in FIG. 8, the pixel circuit according to the third exemplary embodiment has substantially the same structure as that of the pixel circuit shown in FIG. 6, except for the additional scan line $B_n$ connected to the node of the capacitor C12 and the connecting state of the transistor M13. The node of the capacitor C12 is connected to a boosting scan line $B_n$ instead of the selecting scan line $S_n$. As shown in FIG. 9, the boost signal from the boosting scan line $B_n$ has the same waveform as the select signal from the selecting scan line $S_n$.

In addition, in the case in which the transistor M13 is connected between the gate and the drain of the transistor M11 such as shown in FIG. 6, the gate voltage of the transistor M11 may be influenced when the transistor M13 is turned off so that the voltages of the capacitors C11 and C12 are changed. However, in the case in which the transistor M13 is connected to the data line $D_m$ such as shown in FIG. 8, the gate voltage of the transistor M11 is less influenced when the transistor M13 is turned off.

Further, the node voltage of the capacitor C12 increases by the increasing amount $\Delta V_B$ at the voltage of the boost signal from the boosting scan line $B_n$. The increasing amount $\Delta V_G$ at the gate voltage of the transistor M11 is expressed as Equation 8. Accordingly, the increasing amount $\Delta V_B$ at the voltage of the boost signal from the boosting scan line $B_n$ is controlled depending on the parasitic capacitance components of the transistors M11, M12, and M13, thereby controlling the increasing amount $\Delta V_G$ at the gate voltage of the transistor M11 to the desired amount. That is, the current $I_{OLED}$ supplied to the organic EL element OLED can be controlled to the desired current.

Equation 8:

$$\Delta V_G = \frac{\Delta V_B C_{12}}{C_{11} + C_{12}}$$

In addition, when the selecting scan line $S_n$ is connected to the capacitor C12 as shown in FIG. 6, the load of the scan driver 30 for driving the selecting scan line $S_n$ increases by the capacitor C12. However, in the case in which the capacitor C12 is driven to the boosting scan line $B_n$ separate from the selecting scan line $S_n$ as shown in FIG. 8, the load of the scan driver 30 for driving the selecting scan line $S_n$ can be reduced.

In FIG. 9, the driving timings for the select signal, the emit signal, and the boost signal are substantially the same as one another. In other embodiments, however, their driving timings may be different.

Figure 10:
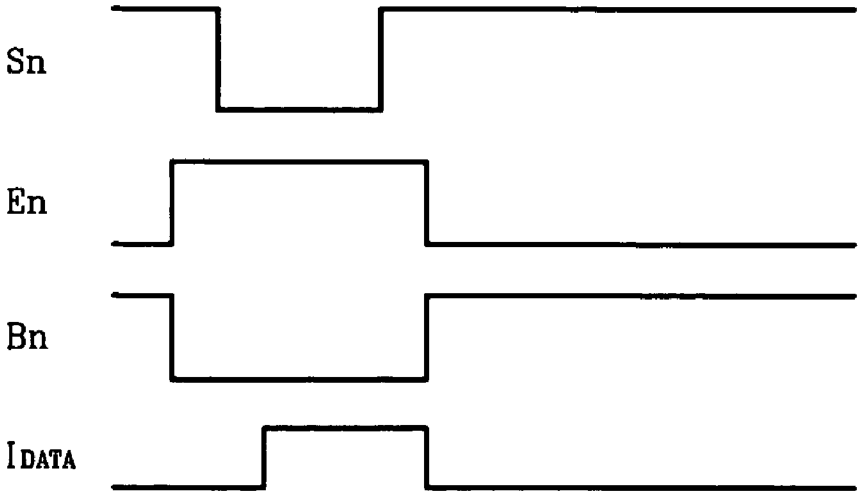
FIGS. 10 and 11 respectively show driving waveform diagrams according to fourth and fifth exemplary embodiments of the present invention for driving the pixel circuit of FIG. 8.

First, the driving waveform according to a fourth exemplary embodiment of the present invention will be described with reference to FIG. 10. FIG. 10 shows a driving waveform diagram according to the fourth exemplary embodiment of the present invention for driving the pixel circuit of FIG. 8.

The transistor M14 is turned off, while the transistors M12 and M13 are turned on in response to the select signal of the selecting scan line $S_n$ and the data current $I_{DATA}$ is transmitted to the transistor M11. If the transistor M14 is turned on and the current flows to the organic EL element OLED while the data current is transmitted to the transistor M11, the current corresponding to the difference between the data current $I_{DATA}$ and the current flowing to the organic EL element OLED flows to the drain of the transistor M11. As a result, a voltage corresponding to this current is stored in the capacitor C11. Meanwhile, since the loads connected to the selecting scan line $S_n$ are different from those connected to the emitting scan line $E_n$ in FIG. 9, the rising time of the select signal may be different from the falling time of the emit signal. Therefore, in the case in which the pulse end of the emit signal is later than the pulse end of the select signal as shown in FIG. 10, the transistor M14 is not turned on while the transistor M12 is turned on.

In addition, since the programming of the data current $I_{DATA}$ is completed after the node voltage of the capacitor C12 has increased if the pulse end of the boost signal from the boosting scan line $B_n$ is faster than the pulse end of the select signal, the advantage obtained by raising the node voltage of the capacitor C12 is removed. Therefore, in the case in which the pulse end of the select signal transmitted to the selecting scan line $S_n$ is faster than the pulse end of the boost signal transmitted to the boosting scan line $B_n$ as shown in FIG. 10, the node voltage of the capacitor C12 increases after the voltage corresponding to the data current $I_{DATA}$ has been stored in the capacitor C11.

Further, if the pulse beginning of the boost signal is later than the pulse beginning of the select signal, the voltage of the capacitor C11 may be changed because the node voltage of the capacitor C12 is reduced while the voltage corresponding to the data current $I_{DATA}$ is stored in the capacitor C11. Since the operation for storing the voltage to the capacitor C11 should be performed again if the voltage of the capacitor C11 is changed, the time during which the voltage is stored in the capacitor is insufficient. Therefore, as shown in FIG. 10, in the case in which the pulse beginning of the select signal transmitted to the selecting scan line $S_n$ is later than the pulse beginning of the boost signal transmitted to the boosting scan line $B_n$, the voltage corresponding to the data current $I_{DATA}$ is stored to the capacitor C11 after the node voltage of the capacitor C12 is reduced.

Figure 11:
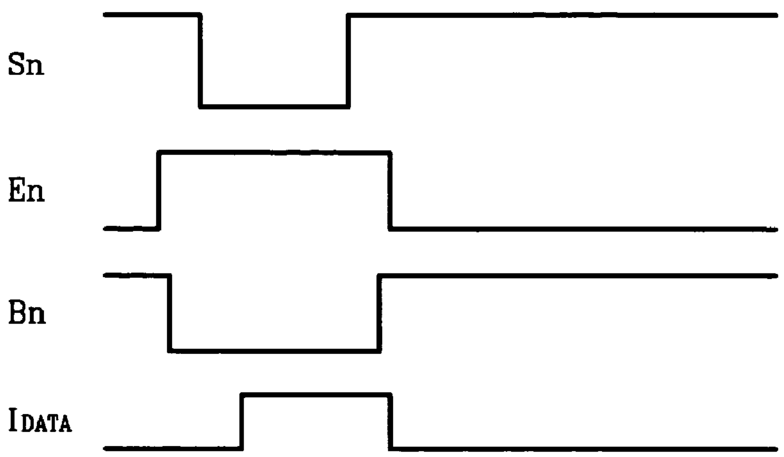

Next, the driving waveform according to a fifth exemplary embodiment of the present invention will be described with reference to FIG. 11. FIG. 11 shows a driving waveform diagram according to the fifth exemplary embodiment of the present invention for driving the pixel circuit of FIG. 8.

In the driving timing shown in FIG. 9, the pulse end of the emit signal may be faster than the pulse end of the boost signal since the loads connected to the boosting scan line $B_n$ are different from the loads connected to the emitting scan line $E_n$. Then, the current flows to the organic EL element OLED during the period between the pulse end of the emit signal and the pulse end of the boost signal before the node voltage of the capacitor C12 increases, so that the organic EL element is stressed. Repeating of this operation may shorten the life span of the organic EL element. However, as shown in FIG. 11, if the pulse end of the boost signal transmitted to the boosting scan line $B_n$ is faster than the pulse end of the emit signal transmitted to the emitting scan line $E_n$, the current flows to the organic EL element after the node voltage of the capacitor C12 increases.

In addition, if the pulse beginning of the emit signal is later than the pulse beginning of the boost signal, the current corresponding to the reduced node voltage of the capacitor C12 flows to the organic EL element OLED during the period between the pulse beginning of the boost signal and the pulse beginning of the emit signal, so that the organic EL element is stressed. If this stress is repeated, the life span of the organic EL element may be shortened. However, as shown in FIG. 11, in the case in which the pulse beginning of the emit signal is faster than the pulse beginning of the boost signal, the node voltage of the capacitor C12 is reduced after the transistor M14 is turned off.

In the second to the fifth exemplary embodiments of the present invention, the transistors M12, M13, and M14 are p-channel transistors. In other embodiments, however, the transistors M12, M13, and M14 may be replaced by n-channel transistors or any suitable combination of p-channel and n-channel transistors. When the transistors M12, M13, and M14 are replaced by n-channel transistors, the select signal and the emit signal have an inverse format of those shown in FIGS. 7, 9, 10, and 11.

Figure 12:
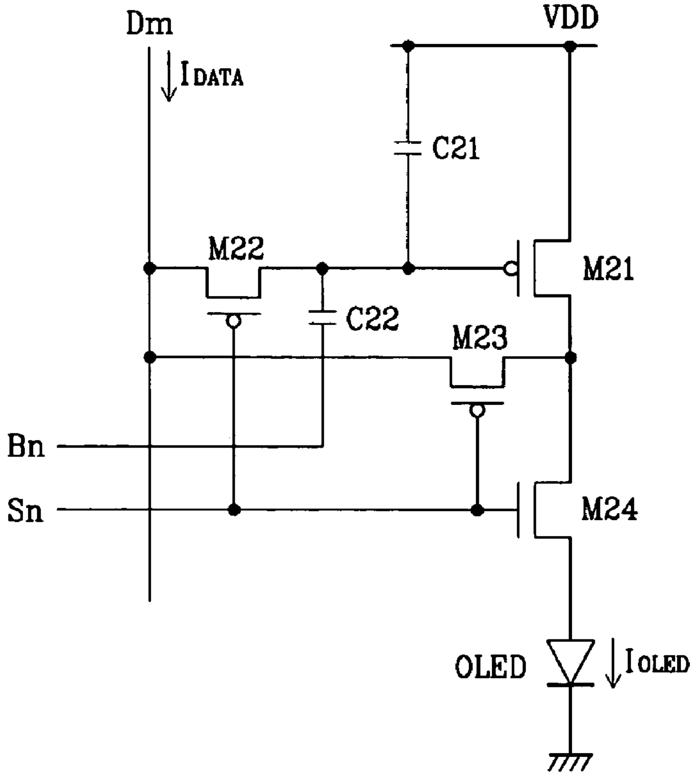
FIGS. 12 and 13 respectively show circuit diagrams of a pixel circuit according to sixth and seventh exemplary embodiments of the present invention.

In particular, in the case in which the transistors M12 and M13 are p-channel transistors and the transistor M14 is replaced by an n-channel transistor, or the transistors M12 and M13 are replaced by n-channel transistors and the transistor M4 is a p-channel transistor, the emitting scan line $E_n$ may be eliminated. This exemplary embodiment will be described with reference to FIG. 12. FIG. 12 shows a circuit diagram of a pixel circuit according to a sixth exemplary embodiment of the present invention.

As shown in FIG. 12, the pixel circuit according to the sixth exemplary embodiment of the present invention has a similar structure as that of the pixel circuit of FIG. 8, except that the selecting scan line $S_n$ is connected to a gate of a transistor M24, which is an n-channel transistor. That is, the gate of the transistor M24 is connected to the selecting scan line $S_n$ instead of the emitting scan line $E_n$. Other than that, transistors M21, M22, M23, M24, capacitors C21, C22 and the organic EL element OLED are interconnected together in substantially the same manner as the corresponding elements of FIG. 8. The transistor M24 is turned off when the select signal from the selecting scan line $S_n$ becomes a low level, and the transistor M24 is turned on when the select signal becomes a high level. Therefore, the operation of the pixel circuit according to the sixth exemplary embodiment is substantially the same as that of the pixel circuit according to the third exemplary embodiment.

Alternatively, in the case in which the transistor M24 is replaced by a p-channel transistor and the transistors M22 and M23 are replaced by n-channel transistors, the select signal transmitted to the selecting scan line $S_n$ has the inverse format of that described in the sixth exemplary embodiment. Since the operation of this exemplary embodiment is easily understood, no further description will be provided.

In the first to the sixth exemplary embodiments, the transistor M11 (or M21) is a p-channel transistor. In other embodiment, however, the transistor M11 (or M21) may be an n-channel transistor. These exemplary embodiments will be described with reference to FIGS. 13 and 14.

Figure 13:
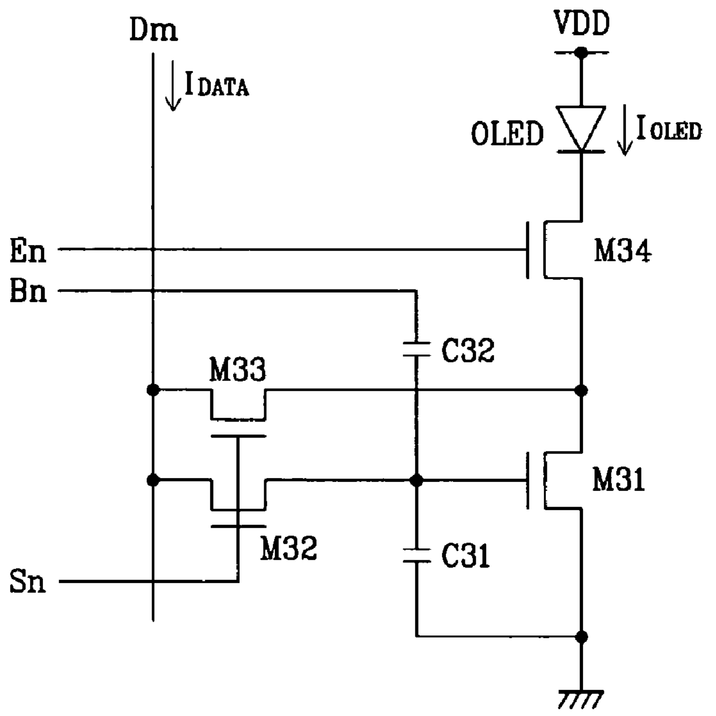
Figure 14:
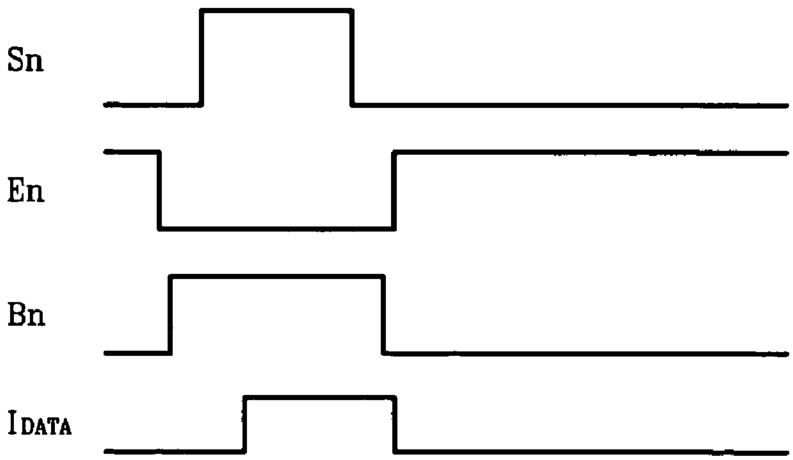
FIG. 14 shows a driving waveform diagram for driving the pixel circuit of FIG. 13.

FIG. 13 shows a circuit diagram of a pixel circuit according to a seventh exemplary embodiment of the present invention, and FIG. 14 shows a driving waveform diagram for driving the pixel circuit of FIG. 13.

Referring to FIG. 13, transistors M31, M32, M33 and M34 are n-channel transistors in the seventh exemplary embodiment, and their connecting state is substantially symmetric with the pixel circuit of FIG. 8. In detail, the transistor M32 is connected between the data line $D_m$ and a gate of the transistor M31, and a gate thereof is connected to the scan line $S_n$. The transistor M33 is connected between a drain and a gate of the transistor M31, and the gate thereof is connected to the selecting scan line $S_n$. The source of the transistor M31 is connected to the cathode voltage, and the drain thereof is connected to the cathode of an organic EL element OLED through the transistor M34. A capacitor C31 is connected between the gate and the source of the transistor M31, and the organic EL element OLED is connected between the transistor M34 and the voltage source VDD. The gate of the transistor M34 is connected to the emitting scan line $E_n$, and the node of a capacitor C32 is connected to the boosting scan line $B_n$.

Since the transistors M32, M33, and M34 are n-channel transistors, the select signal transmitted to the selecting scan line $S_n$ and the emit signal transmitted to the emitting scan line $E_n$ for driving the pixel circuit of FIG. 13 have an inverse format of the signals shown in FIG. 9, as shown in FIG. 14. In addition, since the transistor M31 is an n-channel transistor, the gate voltage $V_G$ of the transistor M31 should be reduced in order to reduce the gate-source voltage $V_{GS}$ of the transistor M31. Therefore, the boost signal transmitted to the boosting scan line $B_n$ has an inverse format of that shown in FIG. 9.

Since a detailed operation of the pixel circuit of FIG. 13 may be easily understood from the description of the third exemplary embodiment, no further description will be provided. In addition, the alternatives described in the above may be applicable to the pixel circuit of FIG. 13, so no detailed description will be provided.

Figure 15:
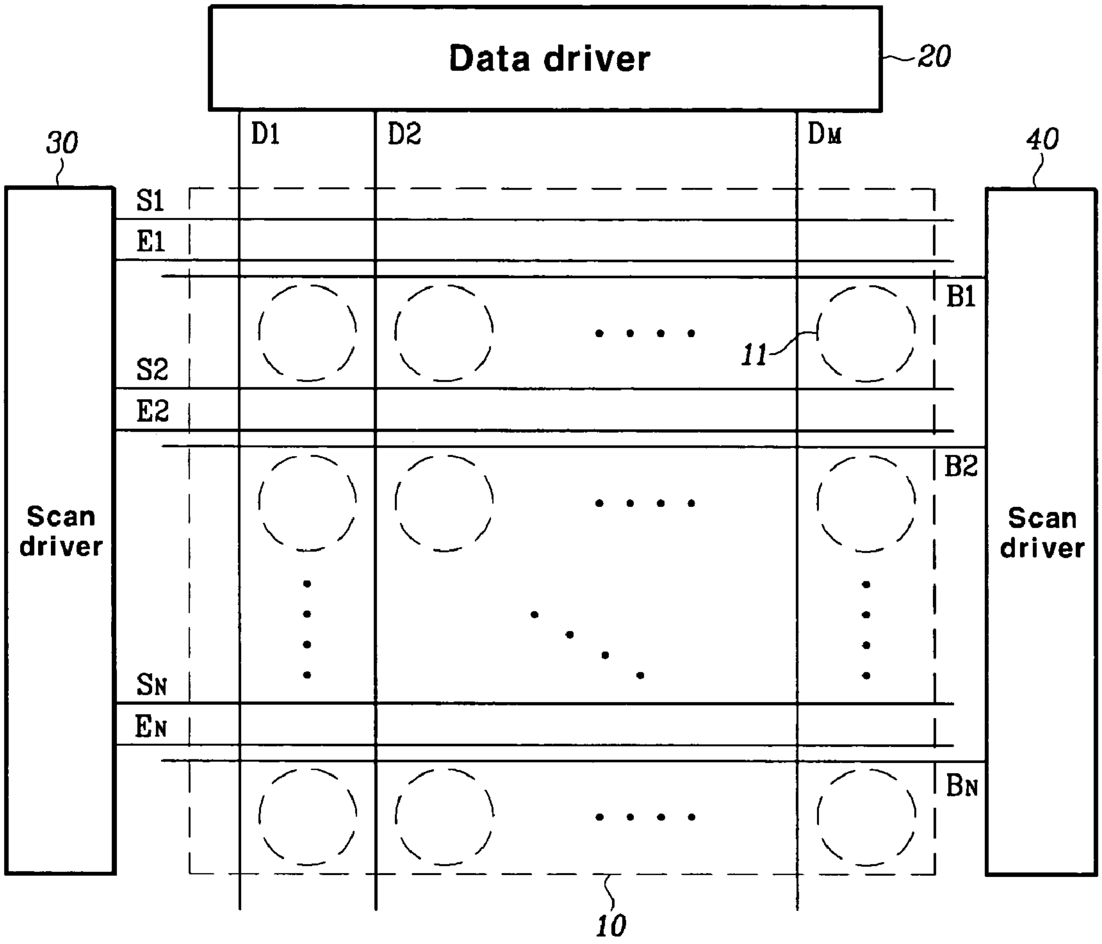
FIG. 15 shows a brief schematic diagram of an organic EL display according to another exemplary embodiment of the present invention.

Next, as described in the third to seventh exemplary embodiments, when the boosting scan line $B_n$ is used separately from the selecting scan line $S_n$, an organic EL display, having an organic EL display panel 10' and pixels 11', further includes a scan driver 40 for driving the boosting scan line $B_n$, as shown in FIG. 15. The scan drivers 30 and 40 will be described with reference to FIGS. 16 to 18.

Figure 16:
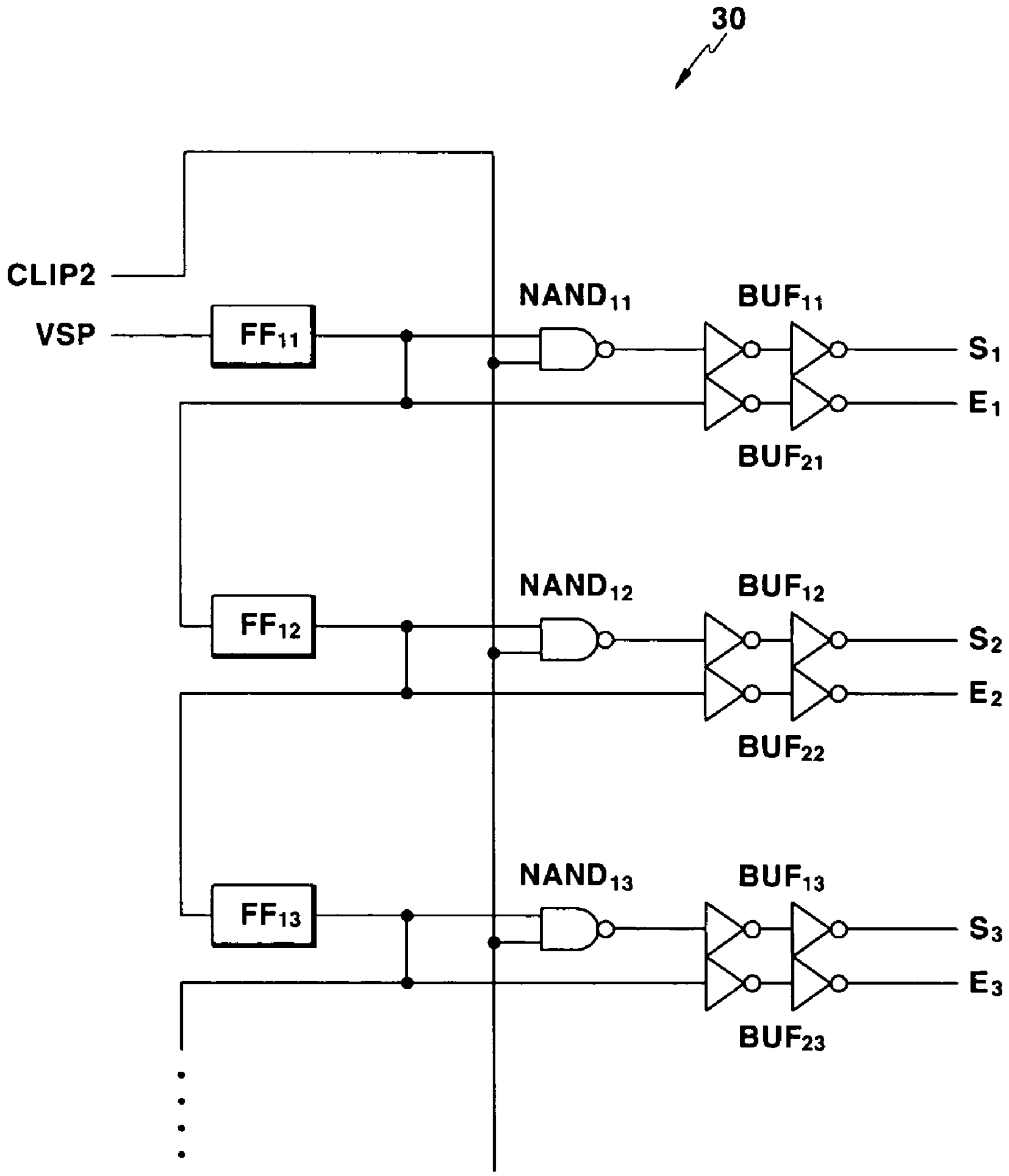
FIG. 16 shows a schematic diagram of the scan driver for driving the selecting scan line and the emitting scan line of the pixel circuit shown in FIG. 8.
Figure 17:
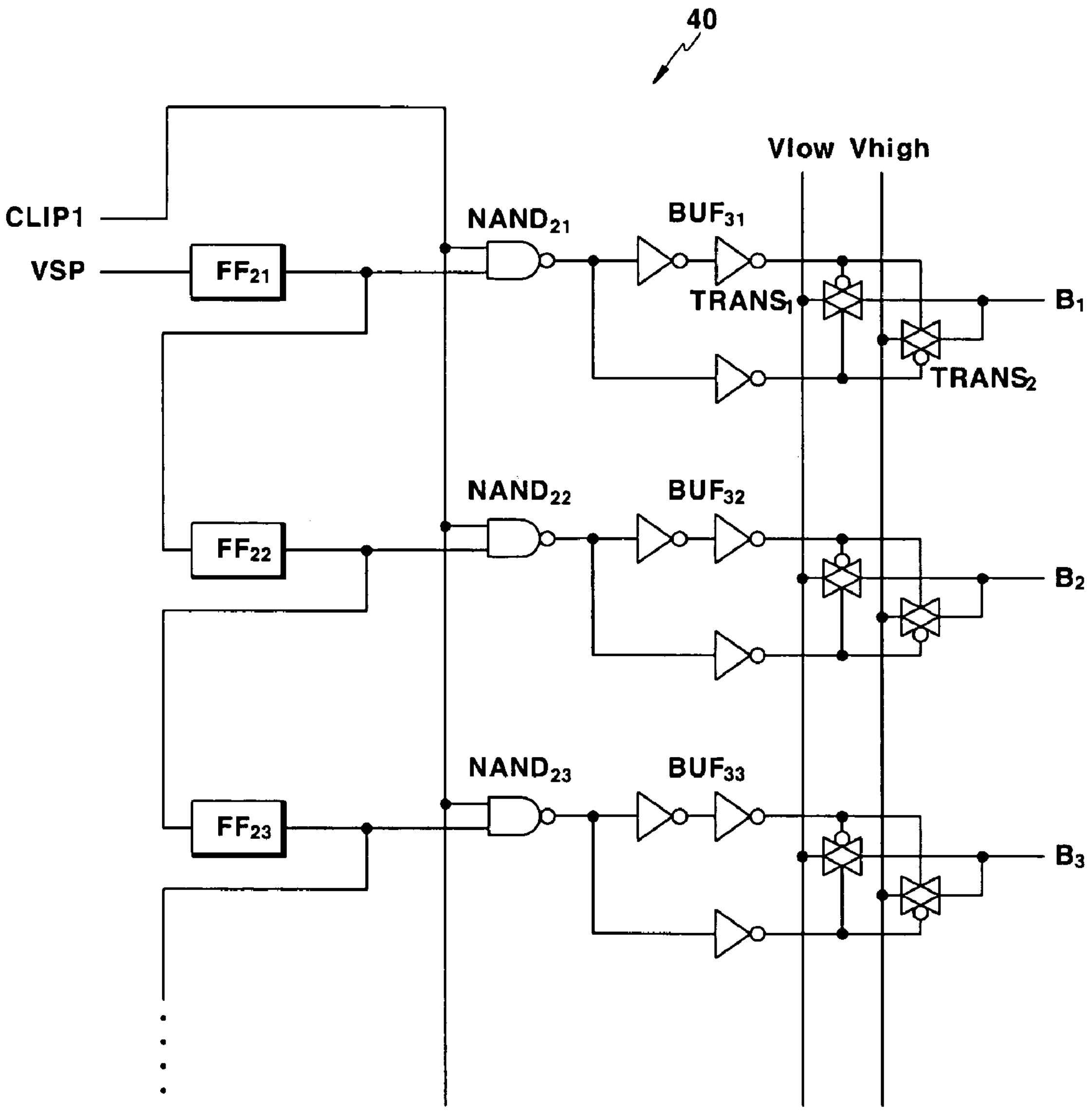
FIG. 17 shows a schematic diagram of the scan driver for driving the boosting scan line of the pixel circuit shown in FIG. 8.
Figure 18:
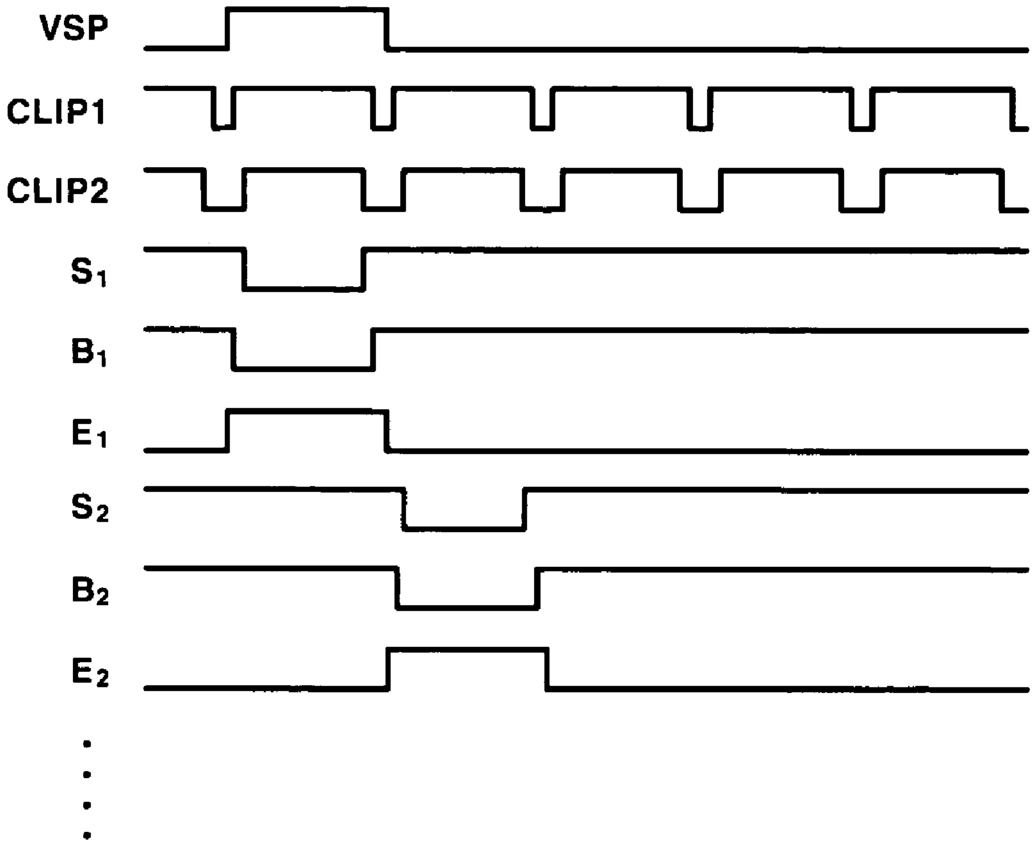
FIG. 18 shows a driving timing diagram of the scan drivers shown in FIGS. 16 and 17.

FIG. 16 shows a schematic diagram of the scan driver for driving the selecting scan line and the emitting scan line of the pixel circuit shown in FIG. 8, and FIG. 17 shows a schematic diagram of the scan driver for driving the boosting scan line of the pixel circuit shown in FIG. 8. FIG. 18 shows a driving timing diagram of the scan drivers shown in FIGS. 16 and 17.

As shown in FIG. 16, the scan driver 30 for driving the selecting scan lines and the emitting scan lines includes N flip-flops $FF_{11}$, to $FF_{1N}$, N NAND gates $NAND_{11}$ to $NAND_{1N}$, and 2N buffers $BUF_{11}$ to $BUF_{1N}$, and $BUF_{21}$ to $BUF_{2N}$. The output ends of the flip-flops $FF_{11}$ to $FF_{1(N-1)}$ are respectively connected to the input ends of the adjacent flip-flops $FF_{12}$ to $FF_{1N}$ such that the flip-flops $FF_{11}$ to $FF_{1N}$ are operated as a shift register. In detail, the output end of the first flip-flop $FF_{11}$ is connected to the input end of the second flip-flop $FF_{12}$, the output end of the second flip-flop $FF_{12}$ is connected to the input end of the third flip-flop $FF_{13}$, and so on. A start pulse VSP is inputted to the input end of the first flip-flop $FF_{11}$.

The output of the flip-flop $FF_{1n}$ (n is an integer, $1 \leqq n \leqq N$) and a clip signal CLIP2 are inputted to the NAND gate $NAND_{1n}$, and the output of the NAND gate $NAND_{1n}$ is inputted to the buffer $BUF_{1n}$. The respective buffers $BUF_{11}$ to $BUF_{1N}$, and $BUF_{21}$ to $BUF_{2N}$ each include a plurality of inverters, and the buffer shown in FIG. 16 includes two inverters. The output end of the buffer $BUF_{1n}$ is connected to the selecting scan line $S_n$. In addition, the output end of the flip-flop $FF_{1n}$ is directly connected to the buffer $BUF_{2n}$, and the output end of the buffer $BUF_{2n}$ is connected to the emitting scan line $E_n$.

Referring to FIG. 17, the scan driver 40 for driving the boosting scan line includes N flip-flops $FF_{21}$ to $FF_{2N}$, N NAND gates $NAND_{21}$ to $NAND_{2N}$, and N buffers $BUF_{31}$ to $BUF_{3N}$. As shown in FIG. 16, the output ends of the flip-flops $FF_{21}$ to $FF_{2(N-1)}$ are connected to the input ends of the adjacent flip-flops $FF_{22}$ to $FF_{2N}$, and the flip-flops $FF_{21}$ to $FF_{2N}$ are operated as a shift register. The start pulse VSP is inputted to the input end of the first flip-flop $FF_{21}$.

The output of the flip-flop $FF_{2n}$ and a clip signal CLIP1 are inputted to the NAND gate $NAND_{2n}$, and the output of the NAND gate $NAND_{2n}$ is inputted to the buffer $BUF_{3n}$. The buffer $BUF_{3n}$ includes two inverters for receiving the output of the NAND gate $NAND_{2n}$, one inverter for receiving the output of the NAND gate $NAND_{2n}$, and two transmission gates $TRANS_1$ and $TRANS_2$ for setting the level of the boost signal, and performs the buffer operation.

The first transmission gate $TRANS_1$ is connected between a signal line $V_{low}$ for supplying the low level voltage and the boosting scan line $B_n$, and outputs the low level voltage to the boosting scan line $B_n$ when the output of the two inverters to which the output of the NAND gate $NAND_{2n}$ is inputted has a low level or the output of the one inverter to which the output of the NAND gate $NAND_{2n}$ is inputted has a high level. The second transmission gate $TRANS_2$ is connected between the signal line $V_{high}$ for supplying the high level voltage and the boosting scan line $B_n$, and outputs the high level voltage to the boosting scan line $B_n$ when the output of the two inverters to which the output of the NAND gate $NAND_{2n}$ is inputted has a high level or the output of the one inverter to which the output of the NAND gate $NAND_{2n}$ is inputted has a low level.

Next, the operation of the scan drivers shown in FIGS. 16 and 17 will be described with reference to FIG. 18.

First, the operation of the scan driver 30 will be described. The start pulse VSP is sequentially outputted through the flip-flops $FF_{11}$ to $FF_{1N}$. The output of the respective flip-flops $FF_{11}$ to $FF_{1N}$ is operated together with the clip signal CLIP2 through the respective NAND gates $NAND_{11}$ to $NAND_{1N}$, and is outputted as a signal having an inverted level of and a shorter width than that of the start pulse VSP, as shown in FIG. 18. These outputs of the NAND gates $NAND_{11}$ to $NAND_{1N}$ are transmitted to the selecting scan lines $S_1$ to $S_N$ as the select signals through the buffers $BUF_{11}$ to $BUF_{1N}$, respectively. In addition, the outputs of the flip-flops $FF_{11}$ to $FF_{1N}$ are transmitted to the emitting scan lines $E_1$ to $E_N$ as the emit signals through the buffers $BUF_{21}$ to $BUF_{2N}$, respectively. When the start pulse has a high level, the emit signals of the emitting scan lines $E_1$ to $E_N$ also have the high level, but the select signals of the selecting scan lines $S_1$ to $S_N$ outputted by the NAND gates $NANA_{11}$ to $NAND_{1N}$ have a low level.

Next, the operation of the scan driver 40 will be described. The start pulse VSP is sequentially outputted through the flip-flops $FF_{21}$ to $FF_{2N}$. The output of the respective flip-flops $FF_{21}$ to $FF_{2N}$ is operated together with the clip signal CLIP1 through the respective NAND gates $NAND_{21}$ to $NAND_{2N}$, and is outputted as a signal having an inverted level of and a shorter width than that of the start pulse VSP. When the outputs of the NAND gates $NAND_{21}$ to $NAND_{2N}$ have a high level, the high level voltages are respectively outputted from the buffers $BUF_{31}$ to $BUF_{3N}$ by the second transmission gates $TRANS_2$. When the outputs of the NAND gates $NAND_{21}$ to $NAND_{2N}$ have a low level, the low level voltages are respectively outputted from the buffers $BUF_{31}$ to $BUF_{3N}$ by the first transmission gates $TRANS_1$.

When the width of the clip signal CLIP2 is wider than that of the clip signal CLIP1 as shown in FIG. 18, the period during which the boost signal transmitted to the respective boosting scan line $B_1$ to $B_N$ has the low level includes the period during which the select signal transmitted to the respective selecting scan line $S_1$ to $S_N$ has the low level. In addition, since the width of the emit signals transmitted to the emitting scan lines $E_1$ to $E_N$ are not shortened by the clip signal CLIP2, the period during which the emit signal has the high level includes the period during which the boost signal has the low level.

Figure 19:
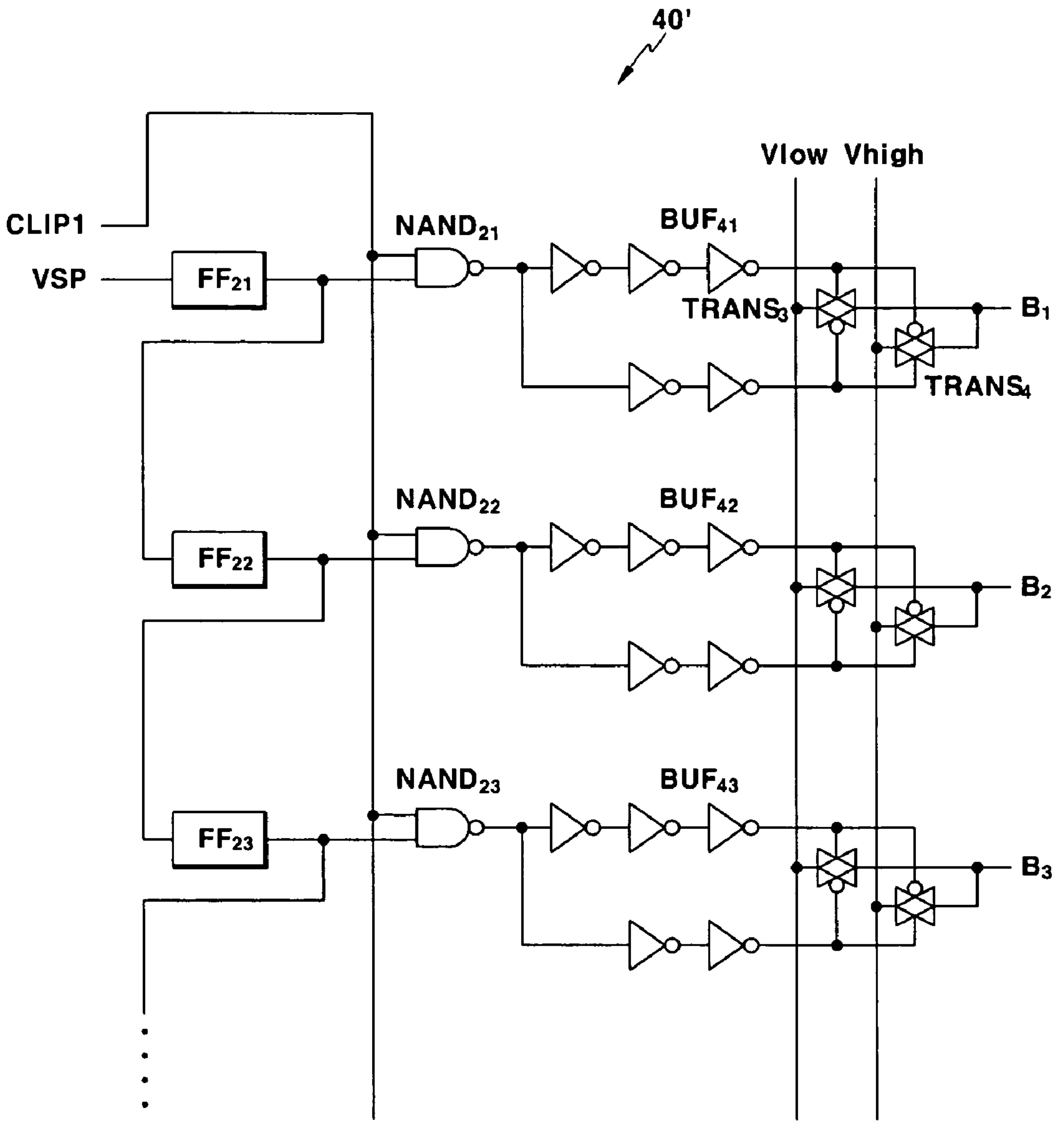
FIG. 19 shows another schematic diagram of the scan driver for driving the boosting scan line of the pixel circuit shown in FIG. 8.

Further, the number of the inverters in the buffers $BUF_{31}$ to $BUF_{3N}$ may be different from the number of the inverters shown in FIG. 17. This exemplary embodiment will be described with reference to FIG. 19. FIG. 19 shows another schematic diagram of a scan driver 40' for driving the boosting scan line of the pixel circuit shown in FIG. 8, which can be used instead of the scan driver 40 of FIGS. 15 and 17.

The scan driver 40' shown in FIG. 19 has substantially the same structure as that shown in the scan driver 40 of FIG. 17 except for the buffers $BUF_{41}$ to $BUF_{4N}$. In detail, the buffer $BUF_{4n}$ includes three inverters for receiving the output of the NAND gate $NAND_{2n}$, two inverters for receiving the output of the NAND gate $NAND_{2n}$, and two transmission gates $TRANS_3$ and $TRANS_4$ for setting the level of the boost signal.

The first transmission gate $TRANS_3$ is connected between the signal line $V_{low}$ for supplying the low level voltage and the boosting scan line $B_n$, and outputs the low level voltage to the boosting scan line $B_n$ when the output of the three inverters to which the output of the NAND gate $NAND_{2n}$ is inputted has the high level. The second transmission gate $TRANS_4$ is connected between the signal line $V_{high}$ for supplying the high level voltage and the boosting scan line $B_n$, and outputs the high level voltage to the boosting scan line $B_n$ when the output of the three inverters to which the output of the NAND gate $NAND_{2n}$ is inputted has the low level.

That is, since the input signal is inverted by the odd number of inverters in FIG. 19, the operations of the transmission gates $TRANS_3$ and $TRANS_4$ are opposite to those of the transmission gates $TRANS_1$ and $TRANS_2$. Since the scan driver 40' shown in FIG. 19 has the same structure as that shown in FIG. 17 except for the buffers, the detailed description for the operation thereof will be omitted.

In FIGS. 16 to 19, the case in which the select signal, the emit signal, and the boost signal are respectively the low level, the high level, and the low level with reference to the pixel circuit shown in FIG. 8 is described, but the scan drivers 30, 40 and 40' shown in FIGS. 16 to 19 are applicable to the case in which the conductive types of the transistors are changed and the levels of these signals are inverted. However, the number of the inverters in the buffer may be changed, or the scan drivers 30, 40 and 40' may be changed depending on the levels of the signals. Since the detailed structures and the detailed operations of these scan drivers 30, 40 and 40' are easily understood from the embodiments described in the above, no further description will be provided.

According to the present invention, since the current flowing to the organic EL element can be controlled using a large data current, the data line can be fully charged during a single line time frame. Further, deviations of threshold voltages of transistors and deviations of mobility are compensated in the current flowing to the organic EL element, and a light-emitting display of high resolution and wide screen can be realized. In addition, the influence according to the parasitic capacitance components of the transistors or data lines can be minimized, and the loads of the scan driver for driving the selecting scan lines can be reduced.

While the present invention has been described in connection with certain exemplary embodiments, it is to be understood that this invention is not limited to the disclosed embodiments, but, on the contrary, is intended to cover various modifications and equivalent arrangements included within the spirit and scope of the appended claims, and equivalents thereof.

What is claimed is:

1. A light-emitting display comprising a plurality of data lines for transmitting data currents, a plurality of first scan lines for transmitting select signals, a plurality of second scan lines for transmitting first control signals, and a plurality of pixel circuits respectively formed at a plurality of pixel areas defined by the data lines and the first scan lines, and coupled to the data lines, the first scan lines and the second scan lines, each said pixel circuit comprising:

a light-emitting element for emitting light based on a driving current, which is applied thereto;

a first switching element for transmitting a corresponding said data current from a corresponding said data line in response to a corresponding said select signal from a corresponding said first scan line;

a first transistor for supplying the driving current applied to the light emitting element to emit light, and being diode-connected irrespective of a level of a corresponding said first control signal while the corresponding said data current is transmitted from the corresponding said data line;

a first storage element for storing a first voltage corresponding to the corresponding said data current from the corresponding said data line; and a second storage element coupled between the first storage element and a corresponding said second scan line, for converting the first voltage of the first storage element into a second voltage through coupling to the first storage element when the corresponding said first control signal is switched from a first level to a second level, wherein the first transistor supplies the driving current corresponding to the second voltage, and the light-emitting element emits light with a brightness corresponding to the driving current.

2. The light-emitting display of claim 1, wherein the first storage element is coupled between a first main electrode and a control electrode of the first transistor, and the second storage element is coupled between the control electrode of the first transistor and the corresponding said second scan line.

3. The light-emitting display of claim 1, wherein each said pixel circuit further comprises a second switching element for transmitting the driving current to the light-emitting element in response to a corresponding one of second control signals.

4. The light-emitting display of claim 3, wherein each said pixel circuit further comprises a third switching element for diode-connecting the first transistor in response to the corresponding said select signal.

5. The light-emitting display of claim 3, wherein the corresponding one of the second control signals is the corresponding said select signal, the first switching element is a first conductive type of transistor, and the second switching element is a second conductive type of transistor.

6. The light-emitting display of claim 3, further comprising a plurality of third scan lines for supplying the second control signals.

7. The light-emitting display of claim 3, wherein a period during which the corresponding one of the second control signals has a disable level includes a period during which the corresponding said select signal has an enable level.

8. The light-emitting display of claim 3, wherein a period during which the corresponding said first control signal has a first level includes a period during which the corresponding said select signal has an enable level.

9. The light-emitting display of claim 3, wherein a period during which the corresponding one of the second control signals has a disable level includes a period during which the corresponding said first control signal has a first level.

10. The light-emitting display of claim 1, further comprising a first scan driver for supplying the select signals to the first scan lines, and a second scan driver for supplying the first control signals to the second scan lines, wherein the second scan driver includes a buffer for determining a magnitude of a first level and a second level of the first control signals and for outputting the first control signals.

11. The light-emitting display of claim 10, wherein the buffer receives an input signal corresponding to the corresponding said first control signal, and outputs a first level voltage and a second level voltage according to the input signal and an inverted signal of the input signal, respectively, to the second scan lines.

12. A light-emitting display comprising a plurality of data lines for transmitting data currents, a plurality of first scan lines for transmitting select signals, a plurality of second scan lines for transmitting first control signals, and a plurality of pixel circuits respectively formed at a plurality of pixel areas defined by the data lines and the first scan lines, and coupled to the data lines, the first scan lines and the second scan lines, each said pixel circuit comprising:

a light-emitting element for emitting light based on a driving current, which is applied thereto;

a first switching element for transmitting a corresponding said data current from a corresponding said data line in response to a corresponding said select signal from a corresponding said first scan line;

a first transistor for supplying the driving current applied to the light emitting element to emit light, and being diode-connected while the corresponding said data current is transmitted from the corresponding said data line;

a first storage element for storing a first voltage corresponding to the corresponding said data current from the corresponding said data line;

a second storage element coupled between the first storage element and a corresponding said second scan line, for converting the first voltage of the first storage element into a second voltage through coupling to the first storage element when a corresponding said first control signal is switched from a first level to a second level, wherein the first transistor supplies the driving current corresponding to the second voltage, and the light-emitting element emits light with a brightness corresponding to the driving current; and a first scan driver for supplying the select signals to the first scan lines, and a second scan driver for supplying the first control signals to the second scan lines, wherein the second scan driver includes a buffer for determining a magnitude of a first level and a second level of the first control signals and for outputting the first control signals, wherein the first scan driver includes a first shift register for sequentially outputting a first signal by shifting a start pulse, and a first logic gate for controlling a width of the first signal using the first signal and a first clip signal having a predetermined cycle, thereby outputting a second signal corresponding to the corresponding said select signal; and the second scan driver includes a second shift register for sequentially outputting a third signal by shifting the start pulse, and a second logic gate for controlling a width of the third signal using the third signal and a second clip signal having a predetermined cycle, thereby outputting a fourth signal corresponding to the corresponding said first control signal.

13. The light-emitting display of claim 12, wherein a width of the first clip signal is wider that a width of the second clip signal.

14. The light-emitting display of claim 13, wherein the first scan driver outputs the first signal to be corresponding to the second control signal.

15. A driving method of a light-emitting display having a plurality of data lines for transmitting data signals, a plurality of first scan lines for transmitting select signals, a plurality of second scan lines for transmitting first control signals, and a plurality of pixel circuits coupled to the data lines, the first scan lines and the second scan lines, each said pixel circuit including a first switching element for transmitting a corresponding said data signal from a corresponding said data line in response to a first level of a corresponding said select signal, a transistor, a second switching element for diode-connecting the transistor in response to the first level of the corresponding said select signal, a first storage element coupled between a main electrode and a control electrode of the transistor, a second storage element coupled between the control electrode of the transistor and a corresponding said second scan line, and a light-emitting element for emitting light based on a driving current from the transistor, the method comprising:

charging a voltage corresponding to the corresponding said data signal in the first storage element and diode-connecting the transistor by changing the corresponding said select signal applied to the first switching element and the second switching element from a third level to the first level while maintaining the corresponding said first control signal at a second level; and changing the corresponding said select signal from the first level to the third level so as to interrupt the corresponding said data signal, and changing the voltage of the first storage element by changing the corresponding said first control signal from the second level to a fourth level.

16. The driving method of claim 15, wherein a period during which the corresponding said first control signal has the second level includes a period during which the corresponding said select signal has the first level.

17. The driving method of claim 15, wherein the light-emitting display further includes a plurality of third scan lines, the method further comprising:

electrically decoupling the light-emitting element from the transistor by setting the corresponding said second control signal to a fifth level when charging a voltage corresponding to the corresponding said data signal in the first storage element; and electrically coupling the light-emitting element to the transistor by setting the corresponding said second control signal to a sixth level when changing the voltage of the first storage element.

18. The driving method of claim 17, wherein a period during which the corresponding said second control signal has the fifth level includes a period during which the corresponding said first control signal has the second level.

19. A light-emitting display panel comprising a plurality of data lines for transmitting data currents, a plurality of scan lines for transmitting select signals, and a plurality of pixel circuits respectively formed at a plurality of pixel areas defined by the data lines and the scan lines, and coupled to the data lines and the scan lines, each said pixel circuit comprising:

a light-emitting element for emitting light based on a driving current, which is applied thereto;

a transistor for supplying the driving current for emitting the light-emitting element;

a first switching element for transmitting a corresponding said data current from a corresponding said data line to the transistor in response to a corresponding said select signal from a corresponding said scan line;

a second switching element for diode-connecting the transistor in response to the corresponding said select signal applied to the second switching element;

a first storage element coupled between a first main electrode and a control electrode of the transistor; and a second storage element coupled between the control electrode of the transistor and a signal line different from the scan lines, the signal line for transmitting a first control signal.

20. The display panel of claim 19, further comprising a third switching element for transmitting the driving current from the transistor to the light-emitting element in response to a second control signal.

21. The display panel of claim 20, wherein the pixel circuit operates in order of:

a first period during which the data current is transmitted to the transistor by the corresponding said select signal; and a second period during which the data current is interrupted, the first control signal is changed from a first level to a second level, and the driving current is transmitted to the light-emitting element in response to the second control signal.

22. The display panel of claim 21, wherein a period during which the second control signal has a disable level includes a period during which the first control signal has the first level, and a period during which the first control signal has the first level includes a period during which the select signal has an enable level.

* * * * *